(12) United States Patent
Wetzl et al.

(10) Patent No.: US 10,416,257 B2
(45) Date of Patent: Sep. 17, 2019

(54) SPIRAL SHAPED MR ACQUISITION TEMPLATE

(71) Applicants: Jens Wetzl, Spardorf (DE); Christoph Forman, Erlangen (DE); Peter Speier, Erlangen (DE)

(72) Inventors: Jens Wetzl, Spardorf (DE); Christoph Forman, Erlangen (DE); Peter Speier, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 256 days.

(21) Appl. No.: 15/437,969

(22) Filed: Feb. 21, 2017

(65) Prior Publication Data

US 2017/0242086 A1  Aug. 24, 2017

(30) Foreign Application Priority Data

Feb. 22, 2016 (DE) .................. 10 2016 202 669

(51) Int. Cl.
*G01R 33/48* (2006.01)
*G01R 33/567* (2006.01)

(52) U.S. Cl.
CPC ..... *G01R 33/4824* (2013.01); *G01R 33/4826* (2013.01); *G01R 33/5673* (2013.01); *G01R 33/5676* (2013.01)

(58) Field of Classification Search
CPC ............ G01R 33/4824; G01R 33/5673; G01R 33/4826; G01R 33/5676
See application file for complete search history.

(56) References Cited

U.S. PATENT DOCUMENTS

| 5,892,358 | A | 4/1999 | King | |
| 9,797,974 | B2 * | 10/2017 | Cheng | G01R 33/56509 |
| 2007/0255130 | A1 | 11/2007 | Du | |
| 2014/0133716 | A1 | 5/2014 | Zenge | |
| 2014/0210469 | A1 * | 7/2014 | Cheng | G01R 33/56509 324/309 |
| 2015/0234024 | A1 | 8/2015 | Grodzki et al. | |

FOREIGN PATENT DOCUMENTS

| DE | 102011086401 A1 | 5/2013 |
| DE | 102014203068 A1 | 8/2015 |

OTHER PUBLICATIONS

German Office Action for related German Application No. 10 2016 202 669.0 dated Aug. 11, 2017.

(Continued)

*Primary Examiner* — Dixomara Vargas
(74) *Attorney, Agent, or Firm* — Lempia Summerfield Katz LLC

(57) ABSTRACT

A method for generating at least one acquisition template for an acquisition of magnetic resonance signals, an acquisition template generating unit, a magnetic resonance apparatus and a computer program product. At least one acquisition template is generated with an acquisition template generating unit. The at least one acquisition template has a plurality of spiral-like spokes in a k-space, each spoke having a plurality of spiral points.

24 Claims, 7 Drawing Sheets

(56) References Cited

OTHER PUBLICATIONS

Steeden J. A. et al: "Self-Navigated Tissue Phase Mapping Using a Golden-Angle Spiral Acquisition-Proof of Concept in Patients with Pulmonary Hypertension"; Magnetic Resonance in Medicine; pp. 145-155;; 2014.
Cheng, J. et. al.: "Free-Breathing Pediatric MRI With Nonrigid Motion Correction and Acceleration", in: Journal of Magnetic Resonance Imaging, 2014, vol. 42, No. 2, pp. 407-420.
Forman, C. et. al.: "High-Resolution 3D Whole-Heart Coronary MRA: A Study on the Combination of Data Acquisition in Multiple Breath-Holds and 1D Residual Respiratory Motion Compensation", in: MAGMA 2014. doi: 10.1007/s10334-013-0428-x.
Wu, Z. el al.: "Anisotropic Field-of-View Support for Golden Angle Radial Imaging", in: Magnetic Resonance in Medicine, 2015, doi: 10.1002/mrm.25898.
Wu, Z. el al.: "Improved scan efficiency for golden-angle radial CMR with anisotropic field-of-view", in: Journal of Cardiovascular Magnetic Resonance, 2016, vol. 18 (Suppl 1), O108;http://www.jcmr-online.com/content/18/S1/O108.

\* cited by examiner

SPIRAL SHAPED MR ACQUISITION TEMPLATE

CROSS REFERENCE TO RELATED APPLICATIONS

This application claims the benefit of DE 102016202669 filed on Feb. 22, 2016, which is hereby incorporated by reference in its entirety.

FIELD

Embodiments relate to a method for generating at least one acquisition template for an acquisition of magnetic resonance signals, an acquisition template generating unit, and a magnetic resonance apparatus.

BACKGROUND

Magnetic resonance tomography, MRT (also magnetic resonance imaging, MRI) is an imaging examination method that is used primarily in medical diagnostics for representing the structure and function of tissues and/or organs in an examination object, for example, a body of a human or animal patient.

In a magnetic resonance apparatus, rapidly switched gradient fields that are generated by a gradient system of the magnetic resonance apparatus are overlaid onto a static basic magnetic field according to at least one acquisition template. The switching events are known as gradient pulses.

Furthermore, high frequency (HF) pulses from a high frequency antenna unit of the magnetic resonance apparatus are radiated into the examination object, causing a magnetization of the examination object. The temporal sequence of gradient pulses and HF pulses may be stipulated by a suitable pulse sequence, often referred to simply as a sequence. The pulse sequence is dependent on the at least one acquisition template.

As a result of the magnetization, magnetic resonance signals are triggered that may be acquired, for example, with the aid of local coils and/or a whole-body coil. On the basis of the acquired magnetic resonance signals, magnetic resonance images may be generated.

SUMMARY AND DESCRIPTION

Embodiments are provided for generating at least one acquisition template that is suitable, for example, for following breathing and/or heart movements.

A method for generating at least one acquisition template for an acquisition of magnetic resonance signals is provided. At least one acquisition template is generated with an acquisition template generating unit. The at least one acquisition template has two or more spiral-like spokes in a k-space, each spoke having a plurality of spiral points, i.e. the plurality of spiral points may lie on the spokes in the k-space.

The at least one acquisition template may refer to an arrangement of acquisition points in a k-space, the acquisition points including the plurality of spiral points. A spoke may refer to a geometric object that includes a plurality of elements, for example, spiral points that have a different spacing from a center point. The spoke may not be described by a straight line, but rather spiral-shaped, e.g. the spiral points lie on a spiral. The spiral may include an angular range of less than 360°, e.g. the spiral completes less than a full rotation.

In an embodiment, magnetic resonance signals are acquired using a magnetic resonance apparatus. From the acquired magnetic resonance signals, for example, images may be reconstructed for diagnostic purposes.

The k-space is sometimes also designated the frequency domain and/or the spatial frequency domain. The coordinates of the k-space may be encoded as a function of a gradient field. The gradient field changes a resonance frequency and also a phase position of a magnetization deflected by an HF pulse location-dependently so that by identification of the phase position and resonance frequency of the measured magnetic resonance signals, positional information may be derived. Different points of the k-space may be scanned using a variation of the gradient field. The k-space may be entirely or partially scanned.

The amount of the magnetization at a particular location of the examination object may be determined, for example, using a Fourier transform that calculates from a signal strength of the magnetic resonance signal that is associated with a particular frequency, specifically the spatial frequency, a signal strength of the signal in the position space. In a merely partial sampling, i.e. an undersampling of the k-space, no direct Fourier transform takes place, rather a compressed sensing (CS) technique is used that carries out further acts in addition to the Fourier transform in order to compensate for information loss due to the undersampling.

The k-space may include an inverse Fourier space to the position space of the examination object, where the magnetic resonance signals may be transformed with the help of a Fourier transform into the position space to generate magnetic resonance images. The gradient field determines a point in the k-space.

Each spoke includes at least one spiral point in the center of the k-space. The center of the k-space contains the information concerning dynamic contrast changes so that the method is configured to follow breathing and/or heartbeat movements. For example, the method may enable self navigation, where for example, hemidiaphragmatic navigators, bellows and/or external ECG signals may be dispensed with.

The spiral points of the spokes lie in an acquisition template plane of a three-dimensional k-space. The acquisition template plane may be, for example, a Cartesian, phase-encoding plane. The acquisition template may be used, for example, for a three-dimensional Cartesian acquisition of magnetic resonance signals.

A readout trajectory according to which the magnetic resonance signals are acquired is allocated to each spiral point. Each readout trajectory intersects the acquisition template plane at the allocated spiral point. The plurality of spiral points may be starting points for the readout trajectories.

A readout trajectory may refer to a series of k-space points that describe a sequence of a change of the gradient field. The acquisition template plane may include, for example, a ky/kz-plane of a three-dimensional k-space in which the plurality of spiral points lie, from where the readout trajectories extend respectively in the kx-direction.

Each of the plurality of spokes of an acquisition template has an offset by a golden angle relative to at least one further spoke of the same acquisition template. The starting points of the readout trajectories lie on a series of spiral-shaped spokes. Each spoke has an offset by the golden angle relative to a preceding spoke, e.g. the (n+1)th spoke is rotated through the golden angle relative to the nth spoke.

The golden angle $\varphi$ golden may be understood to be, an angle of $\varphi$ golden,s=$\pi$(3−50.5) in radians and/or approximately φ golden,s≈137.5° in degrees, that may also be designated the small golden angle or an angle of φ golden, b=π(50.5−1) in radians and/or approximately φ golden, b≈222.5° in degrees, that may also be designated the large golden angle. By repeated rotation through the golden angle, positions result that never exactly coincide with one another. In addition, a rotation by the golden angle provides an even coverage of the k-space since the (n+1)th spoke lies centrally in the large region that is not yet covered by the previous n spokes.

In one embodiment, the number of the plurality of spiral points per spoke is defined dependent upon a temporal resolution. From a desired temporal resolution, for example, the number of the plurality of spiral points may be deduced.

With a small number of the plurality of spiral points, a time for acquiring the magnetic resonance signals according to the at least one acquisition template may be kept small so that a high temporal resolution is enabled.

In the event that each spoke includes at least one point in the center of the k-space, the temporal resolution may correspond to the temporal spacing of repeated scans of the k-space center. The fewer spiral points that are acquired by a spoke, the quicker the scan of the magnetic resonance signals allocated to the spokes and the repeated scanning of the k-space center may take place.

In one embodiment, the number of spokes is defined dependent upon an undersampling. From an undersampling, for example, the number of the spokes may be deduced. The number of spokes is stipulated once the number of the plurality of spiral points has been stipulated.

In contrast to a spiral-shaped phyllotactic acquisition template, the number of the spokes is not restricted to a Fibonacci number, but may be any natural number.

The position of the plurality of spiral points of a spoke may be dependent on the number of the plurality of spiral points per spoke Np and/or an unsharpness value ξ and/or an angular range value φ rotation and/or a golden angle φ golden and or an angular offset value φ offset. The position of the plurality of spiral points may be stipulated in a simple and efficient manner.

The angular offset value φ offset may herein represent an angular offset for the totality of the spokes. All the spokes of the same acquisition template may be rotated by φ offset.

The angular range value φ rotation may describe an angular difference between a first and a last spiral point of a spoke.

The unsharpness value ξ may be randomized and/or selected randomly. The unsharpness value ξ may relate, for example, to a radial coordinate r and/or an angular coordinate φ. If the unsharpness value ξ relates to the radial coordinate r, then the unsharpness value ξ may be denoted as ξr. If the unsharpness value ξ relates to the radial coordinate φ, then the unsharpness value ξ may be denoted as ξφ.

With the unsharpness value, the irregularity of the at least one acquisition template may be increased so that the at least one acquisition template is, for example, configured for compressed sensing techniques. With a direct reconstruction by a Fourier transform, a greater irregularity of the template may be achieved. For example, with a slight undersampling, i.e. with almost complete acquisition of the k-space, magnetic resonance images of high quality may be generated, even without compressed sensing techniques.

The calculation of the position of a spiral point i (i∈[0, Np[) of a single spoke s (s ∈[0,Ns[) may take place in polar coordinates ri,s and φi,s, for example, on the basis of the following formulae:

$$r_{i,s} = \frac{i}{N_p - 1} + \xi_{r,i,s} \qquad (1)$$

$$\varphi_{i,s} = \varphi_{rotation} \cdot \frac{i}{N_p - 1} + s \cdot \varphi_{golden} + \varphi_{offset} + \xi_{\varphi,i,s} \qquad (2)$$

Unsharpness values ξr,i,s and/or ξφ,i,s may also be omitted. ξr,i,s is smaller than the radial spacing between two successive points, for example 1/(Np−1) according to the above formula (1). Similarly, ξr,i,s may be smaller than the angular spacing between two successive points, for example φrotation/(Np−1) according to the above formula (2).

A further variant of the method provides that the position of the plurality of spiral points is transformed from a polar coordinate system into a Cartesian coordinate system.

A polar coordinate system, for example, may also be designated a circular coordinate system and may be, for example, a two-dimensional coordinate system in which each point in a plane is specified by a spacing from a pre-defined point and an angle from a pre-defined direction. The pre-set point may be designated a pole. The pre-set point may correspond to the origin in a Cartesian coordinate system. The spacing from the pole is denoted, for example, as r and is referred to as the radial coordinate and/or the radius. The angle may be denoted as φ and is referred to as the angular coordinate and/or the polar angle and/or azimuth.

A Cartesian coordinate system may be a two-dimensional, orthogonal coordinate system.

A transformation takes place dependent upon at least one extent of an image region (field of view, FoV) and/or a point density distribution.

The image region may be a two-dimensional region in a k-space, that corresponds to an imaging region of the examination object. The at least one acquisition template may be individually adapted to the desired examination of the examination object.

The point density distribution may be a distribution that determines a direction dependent density of spiral points dependent upon a spacing from the center of the k-space.

A conversion from polar coordinates ri,s and φi,s into Cartesian coordinates yi,s and zi,s may take place, for example, using the following formulae:

$$Y_{i,s} = \frac{w_y}{2} \cdot r_{i,s}^{1/v_y} \cdot \cos \varphi_{i,s} \qquad (3)$$

$$Z_{i,s} = \frac{w_z}{2} \cdot r_{i,s}^{1/v_z} \cdot \sin \varphi_{i,s} \qquad (4)$$

The extent of the image region in the direction of the ky-axis of the k-space is given by wy and in the direction of the kz-axis by wz. The point density distribution in the direction of the ky-axis is given by vy and in the direction of the kz-axis by vz.

The position of the plurality of spiral points is rastered. The position facilitates further processing and use of the at least one acquisition template since, for example, a uniform Fourier transform is enabled.

Rastering may refer to an allocation of the plurality of spiral points to grid points of a grid in the k-space. The grid points may be interpreted as possible sampling points, e.g. if a spiral point is allocated to a grid point, the spiral point may be designated a sampling point. A grid in the k-space may refer to a multidimensional, e.g. two-dimensional, arrangement. For example, a two-dimensional grid may be generated by two k-space axes, e.g. a ky-axis and a kz-axis. The k-space axes may be arranged into grid coordinates, i.e. the k-space axes may be discretized. In a two-dimensional grid, grid points result that may each be defined by two grid coordinates, e.g. a ky grid coordinate and a kz coordinate.

The rasterization may be described, for example, by the following formulae:

$$\hat{y}_{i,s} = \text{round}(y_{i,s}) \quad (5)$$

$$\hat{z}_{i,s} = \text{round}(z_{i,s}) \quad (6)$$

In an embodiment, an anisotropic image region correction is carried out.

An anisotropic image region may be present if the image region has a different extent in one direction, e.g. kz than in another direction, e.g. ky. The at least one acquisition template, that has originally been generated isotropically on a unit circle, is stretched and/or compressed to an ellipse. An undersampling in the direction of the greater extent is greater than in the direction of the lesser extent. The effect may be compensated out using an anisotropic image region correction.

In the anisotropic image region correction, equal-lengthened angular regions may correspond to the original angular coordinates of equal-sized arc lengths of the corrected angular coordinates.

A first and a second original angular coordinate may enclose a first angular region and the second and a third original angular coordinate may enclose a second angular region. The first and the second angular regions are equal-sized. The first and third angular coordinates may not be identical. In addition, a first corrected angular coordinate may be allocated to the first original angular coordinate, a second corrected angular coordinate may be allocated to the second original angular coordinate and a third corrected angular coordinate may be allocated to the third original angular coordinate. The first and the second corrected angular coordinates adjoin a first arc length and the second and third corrected angular coordinates adjoin a second arc length, where the first and the second arc length are equally long.

For example, in the anisotropic image region correction, an allocation of evenly scanned polar angles to corresponding segment lengths is inverted on the periphery of an image region ellipse. An incomplete elliptical integral of the second kind $E(\varphi)$, that is normalized to the complete integral $E_{complete}$ over the whole ellipse, may be calculated numerically for evenly distributed angles $\varphi$ in the range $[0, 2\pi[$. The calculation may be described by the following formulae:

$$E(\varphi') = \frac{2\pi}{E_{complete}} \cdot \int_0^{\varphi'} \sqrt{1 - k^2 \sin^2 \theta} \, d\theta \quad (7)$$

$$k = \sqrt{1 - \left(\frac{w_z}{w_y}\right)^2} \quad (8)$$

For the anisotropic image region correction a corrected angular coordinate $\varphi'$ may be allocated to an original angular coordinate $\varphi$ of a spiral point. The allocation may take place with the aid of an allocation chart.

The allocation may take place, for example, using the equation $\varphi = E^{-1}(\varphi)$, from which the allocation chart may be derived. The correction may be inserted into equations (3) and (4) by replacing the original angle $\varphi_{i,s}$ by $E^{-1}(\varphi)$. For an isotropic case where wy=wz, the inverse allocation results in the identity $\varphi = E^{-1}(\varphi)$.

In an embodiment, the position of at least one of the plurality of spiral points is checked for duplicity. The test for duplicity is carried out following an anisotropic image region correction.

A direct duplicity of a position exists if two or more spiral points in the k-space lie on the same grid point.

When checking for duplicity symmetry properties of the k-space are taken into account. For example, whether two or more spiral points in the k-space in lie mirrored about the center of the k-space, e.g. a mirrored duplicity.

Duplicity, for example, direct and/or mirrored duplicity is prevented. Therefore, given the existence of duplicity, at least one alternative position is sought.

The checking of alternative positions is delimited by a search radius. The search may be made efficient. Furthermore, the delimitation of the search radius provides that large jumps in the gradient magnetic field do not occur due to a possible displacement of a spiral point. Any artifacts resulting therefrom in reconstructed magnetic resonance images may be prevented.

The search radius defines in which region about an original grid point for which duplicity exists, alternative grid points may be sought. For example, during the search, only grid points that directly adjoin the original grid point parallel to a grid axis, for example to the ky axis and/or the kz axis and/or diagonally, for example, parallel to a bisector of the ky and kz axis are taken into account.

When finding at least two alternative positions, one of the at least two alternative positions is randomly defined as a new position, i.e. the allocation of the new position takes place randomly.

For example, initially for each of the at least one acquisition templates, a preliminary acquisition template may be generated that is tested for duplicity. Any identical and/or mirrored sampling points of the at least one preliminary acquisition template may be identified. The sampling points may be displaced onto adjacent grid points in a randomized manner. The process may take place iteratively and, for example, be interrupted if no more identical and/or mirrored sampling points are present or if all the adjacent grid points are already occupied.

A, for example rectangular, region of the k-space scanned completely over the plurality of acquisition templates, that is located in the center of the k-space, is maximized.

Through the avoidance of duplicity, for example using a randomized determination of new positions, the incoherence of the at least one acquisition template may be increased.

In an embodiment a plurality of acquisition templates are generated. A plurality of acquisition templates may be used for a time-resolved scan. A time-resolved scan may be a dynamic scan that images, for example, a movement process of the examination object and/or in the examination object.

A first acquisition template may be used at a first time point and a further acquisition template may be used at a further time point, that is, a first acquisition template is allocated to a first time point, a second acquisition template is allocated to a second time point, etc.

The time points may be absolute and/or relative time points. If the acquisition templates are allocated to absolute time points, then the respective acquisition template is recorded completely, i.e. initially, for example, a complete first acquisition template at a first absolute time point, then a complete second acquisition template at a second absolute time point, etc.

Relative time points relate to time points within a periodically repeating process, for example, heartbeats and/or breathing movements. Thus, for example, at a first relative time point, a spoke of a first acquisition template, then at a second relative time point, a spoke of a second acquisition template, etc. are recorded. Thereafter, at the first relative time point, a second spoke of the first acquisition template, then at the second relative time point, a second spoke of the second acquisition template, etc. are recorded.

For example, in a recording of different heart phases across a plurality of heartbeats with ECG triggering after each R-wave of the ECG signal, a spoke of the first acquisition template, then a spoke of the second acquisition template is recorded, etc. At the next R-wave, the process repeats accordingly. Thus, with each acquisition template, one heart phase may be recorded. A relative time point may be understood as a phase of a periodic process.

A spoke of one of each of the plurality of acquisition templates has an offset by a golden angle relative to a spoke of a further of the plurality of acquisition templates. An even scan of the k-space may be achieved over time with time-resolved scans.

The offset of the spokes between the plurality of acquisition templates may be described, for example, on the basis of an angular offset value $\varphi$ offset, p of an acquisition template t. Herein, t may be a natural number including zero where t∈[0,T[, where T is the number of the plurality of acquisition templates. The angular offset value $\varphi$ offset, t of an acquisition template t may replace the angular offset value $\varphi$ offset in equation (2).

The angular offset value $\varphi$ offset, t of an acquisition template p may be expressed, for example, with the following formula:

$$\varphi_{offset,t} = t \cdot N_2 \cdot \varphi_{golden} \quad (9)$$

Using equation 9, the first spoke of the acquisition template t is offset relative to the last spoke of the acquisition template t−1 by the golden angle. Each spoke may be unique relative to all the other spokes of all acquisition templates.

The test for duplicity described above, may be used similarly for more than just one acquisition template on the spokes of at least a portion of the plurality, for example all, of the acquisition templates. No and/or as few as possible identical and/or mirrored sampling points occur across all the phases.

Furthermore, an acquisition template generating unit is provided that is configured to carry out a method for generating at least one acquisition template for an acquisition of magnetic resonance signals. The acquisition template generating unit may include one or more processors and/or a memory store.

The acquisition template generating unit may be configured, for example, to be integrated into a magnetic resonance apparatus and/or may include a data interface that is configured to transfer data to a magnetic resonance apparatus. The acquisition template generating unit may function independently of a magnetic resonance apparatus.

In an embodiment, a magnetic resonance apparatus with an acquisition template generating unit is provided that is configured to carry out a method for generating at least one acquisition template for an acquisition of magnetic resonance signals. The magnetic resonance apparatus may include, for example, a system control unit for controlling the magnetic resonance apparatus. The magnetic resonance apparatus may include the acquisition template generating unit.

In an embodiment, a computer program product is provided that includes a program and is loadable into a memory store of a programmable computer unit of an acquisition template generating unit and programming unit. The program may include, for example, libraries and auxiliary functions in order to carry out a method for generating at least one acquisition template for an acquisition of magnetic resonance signals when the computer program product is executed in the acquisition template generating unit. The computer program product may include software with source code that is compiled and linked or which is interpreted, or an executable software code that, for execution, may only be loaded into the acquisition template generating unit. The computer program product is configured to carry out the acts using the acquisition template generating unit. The acquisition template generating unit may have the respective pre-conditions such as, for example, a suitable working memory store, a suitable graphics card or a suitable logic unit so that the respective acts may be carried out efficiently.

The computer program product is stored, for example, on a computer-readable medium or is deposited on a network or server from where the compute program product may be loaded into the processor of a local acquisition template generating unit. The local acquisition template generating unit may be directly connected to the acquisition template generating unit or may be configured as part of the acquisition template generating unit. Furthermore, control information of the computer program product may be stored on an electronically readable data storage medium. The items of control information of the electronically readable data storage medium may be configured such that items of control information carry out the method when the data storage medium is used in an acquisition template generating unit. Examples of electronically readable data storage media are a DVD, a magnetic tape or a USB stick, on which electronically readable control information, for example software, is stored.

The scope of the present invention is defined solely by the appended claims and is not affected to any degree by the statements within this summary. The present embodiments may obviate one or more of the drawbacks or limitations in the related art.

DETAILED DESCRIPTION

Figure 1:
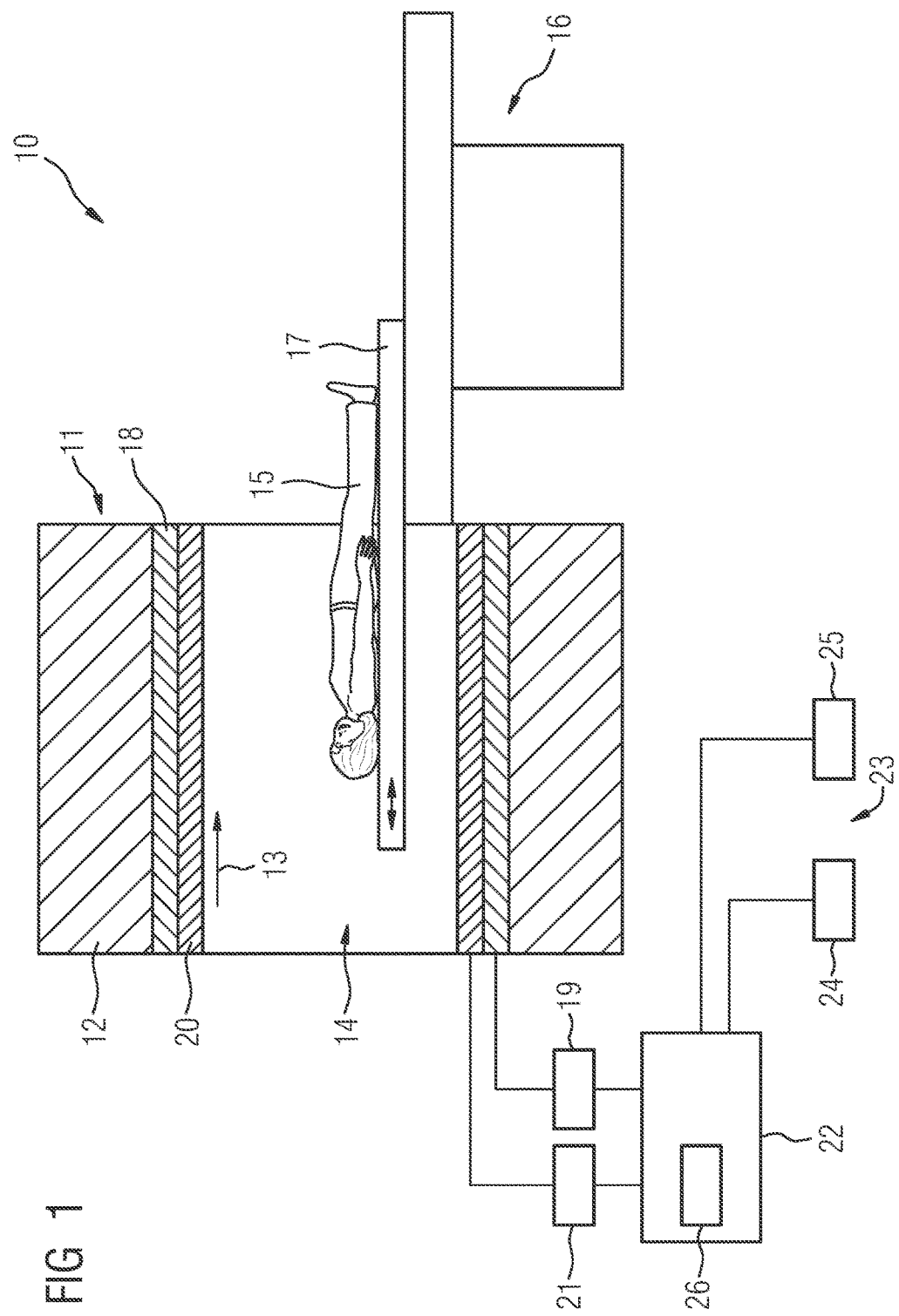
FIG. 1 depicts a schematic representation of a magnetic resonance apparatus according to an embodiment.

FIG. 1 depicts schematically a magnetic resonance apparatus 10. The magnetic resonance apparatus 10 includes a magnet unit 11 that includes a superconducting main magnet 12 for generating a strong and constant main magnetic field 13. In addition, the magnetic resonance apparatus 10 includes a patient accommodating region 14 to accommodate a patient 15. In an embodiment, the patient accommodating region 14 is configured cylindrical and is surrounded cylindrically in a peripheral direction by the magnet unit 11. A configuration of the patient accommodating region 14 deviating therefrom is possible. The patient 15 may be pushed by a patient support apparatus 16 of the magnetic resonance apparatus 10 into the patient accommodating region 14. The patient support apparatus 16 includes a patient table 17 that is configured to be movable within the patient accommodating region 14.

The magnet unit 11 also includes a gradient coil unit 18 for generating magnetic field gradients that are used for position encoding during an imaging process. The gradient coil unit 18 is controlled by a gradient control unit 19 of the magnetic resonance apparatus 10. The magnet unit 11 further includes a high frequency antenna unit 20 that is configured as a body coil that is firmly integrated into the magnetic resonance apparatus 10. The high frequency antenna unit 20 is configured to excite a magnetization that forms in the main magnetic field 13 generated by the main magnet 12. The high frequency antenna unit 20 is controlled by a high frequency antenna control unit 21 of the magnetic resonance apparatus 10 and radiates HF pulses, for example excitation pulses and/or refocusing pulses, according to a pre-determined pulse sequence into an examination space that is substantially formed by a patient accommodating region 14 of the magnetic resonance apparatus 10. The high frequency antenna unit 20 is also configured for receiving magnetic resonance signals.

For controlling the main magnet 12, the gradient control unit 19 and for controlling the high frequency antenna control unit 21, the magnetic resonance apparatus 10 includes a system control unit 22. The system control unit 22 centrally controls the magnetic resonance apparatus 19, for example, the execution of the pulse sequence. In order to generate the pulse sequence, the system control unit includes an acquisition template generating unit 26 that is configured to carry out a method for generating at least one acquisition template for an acquisition of magnetic resonance signals. The acquisition template generating unit 26 may, for example, include a programmable computer unit (not shown) that includes one or more processors and/or a memory store.

A program is loadable into the memory store of the programmable computer unit in order to carry out a method for generating at least one acquisition template for an acquisition of magnetic resonance signals when the program is executed in the computer unit.

Further, the system control unit 22 includes an evaluation unit (not shown in detail) for evaluating medical image data that is acquired during the magnetic resonance examination. Further, the magnetic resonance apparatus 10 includes a user interface 23 that is connected to the system control unit 22. Control information such as, for example, imaging parameters and reconstructed magnetic resonance images may be displayed on a display unit 24, for example on at least one monitor, of the user interface 23 for medical operating personnel. In addition, the user interface 23 includes an input unit 25 by means of which information and/or parameters can be input by the medical operating personnel during a scanning procedure.

Figure 2:
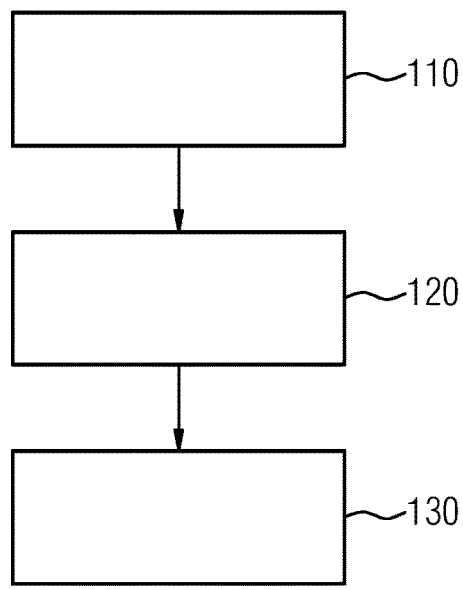
FIG. 2 depicts a block diagram of a variant of the method according to an embodiment.

FIG. 2 depicts a method for generating at least one acquisition template for an acquisition of magnetic resonance signals. At act 110, at least one acquisition template with a plurality of spiral points is generated by the acquisition template generating unit 26. At act 120, an anisotropic image region correction is carried out. Following the anisotropic image region correction, at act 130, the positions of the plurality of spiral points are checked for duplicity and, if necessary, corrected.

The checking and correction of the positions of the plurality of spiral points in act 130 takes into account the previously generated acquisition templates, i.e. if in act 110, more than just one acquisition template is generated, in act 130, the spiral points of each acquisition template are not considered individually, but all together.

Figure 3:
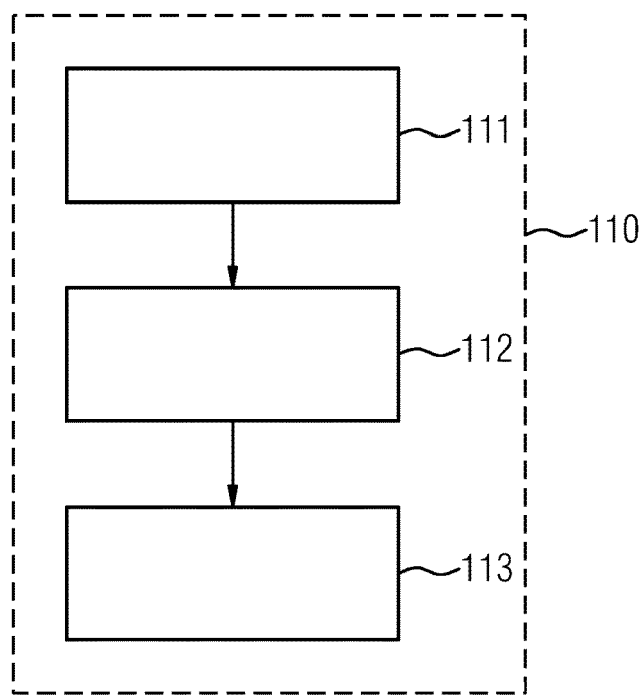
FIG. 3 depicts a block diagram of a method according to an embodiment.
Figure 4:
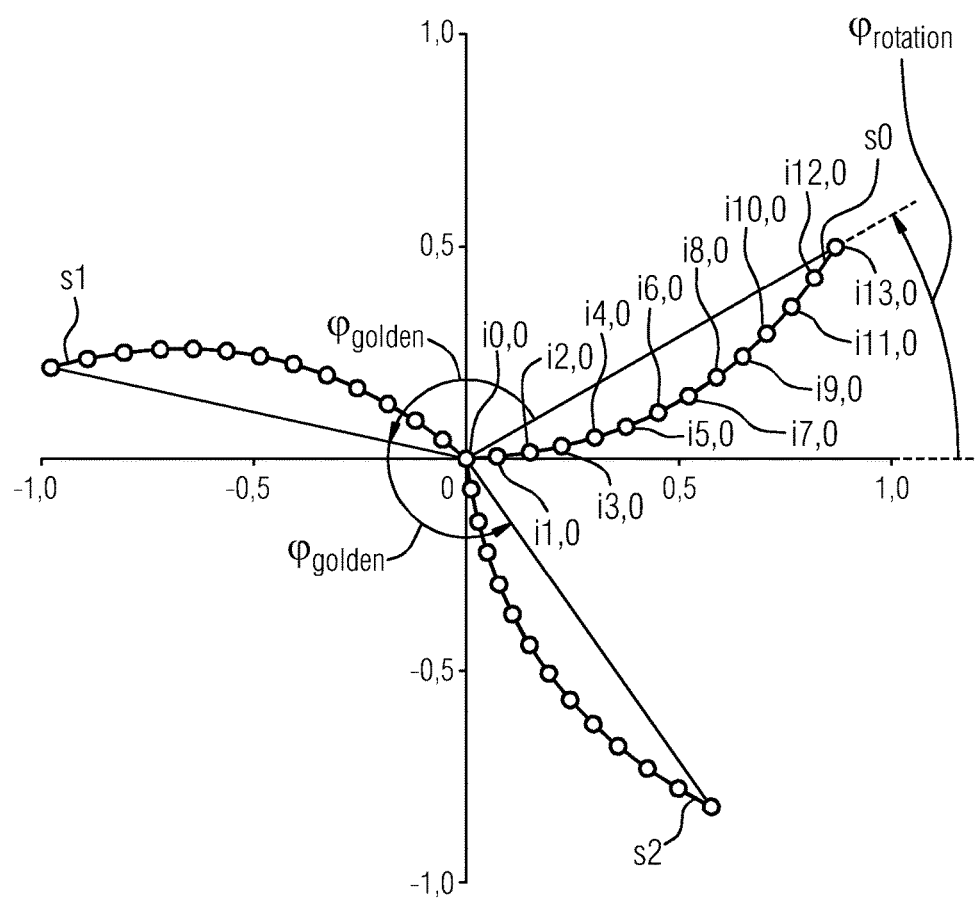
FIG. 4 depicts a sketch of the principle of a generation of spiral points according to an embodiment.

In FIG. 3, act 110 is subdivided into substeps. In act 111, spiral points are generated that are arranged on spiral shaped spokes. For example, as depicted in FIG. 4, three spokes s0, s1, s2 and in each case fourteen spiral points that, taking the example of the spoke s0, are provided with reference signs i0,0, i1,0, i2,0, i3,0, i4,0, i5,0, i6,0, i7,0, i8,0, i9,0, i10,0, i11,0, i12,0, i13,0. Here, the spoke s0 has, relative to the spoke s1, and the spoke s1 has, relative to the spoke s2, an offset by the golden angle φ golden.

The position of the spiral points i is calculated dependent upon a number of spiral points per spoke Np, an angular range value φ rotation, the golden angle φ golden, an angular offset value φ offset and an unsharpness value ξ according to the equations (1) and (2), where here φ offset=ξ=0 has been selected.

At act 112, the position of the spiral points is transformed from a polar coordinate system into a Cartesian coordinate system. The transformation is done on the basis of the equations (3) and (4). The transformation takes place dependent upon at least one extent of an image region and/or at least one point density. At act 113, the position of the plurality of spiral points is rastered using equations (5) and (6).

Figure 7:
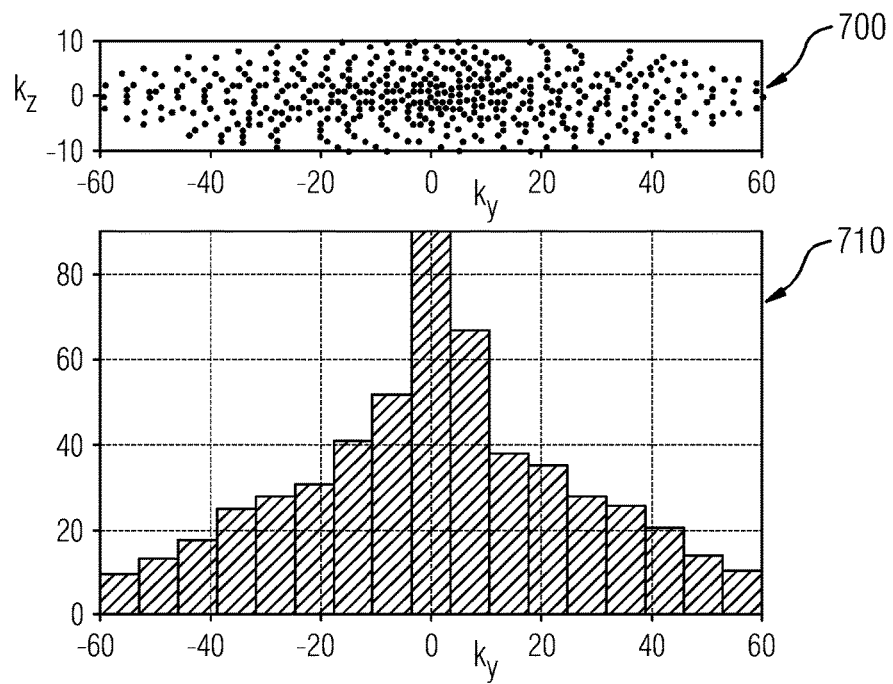
FIG. 7 depicts a representation of an acquisition template before an anisotropic image region correction according to an embodiment.
Figure 8:
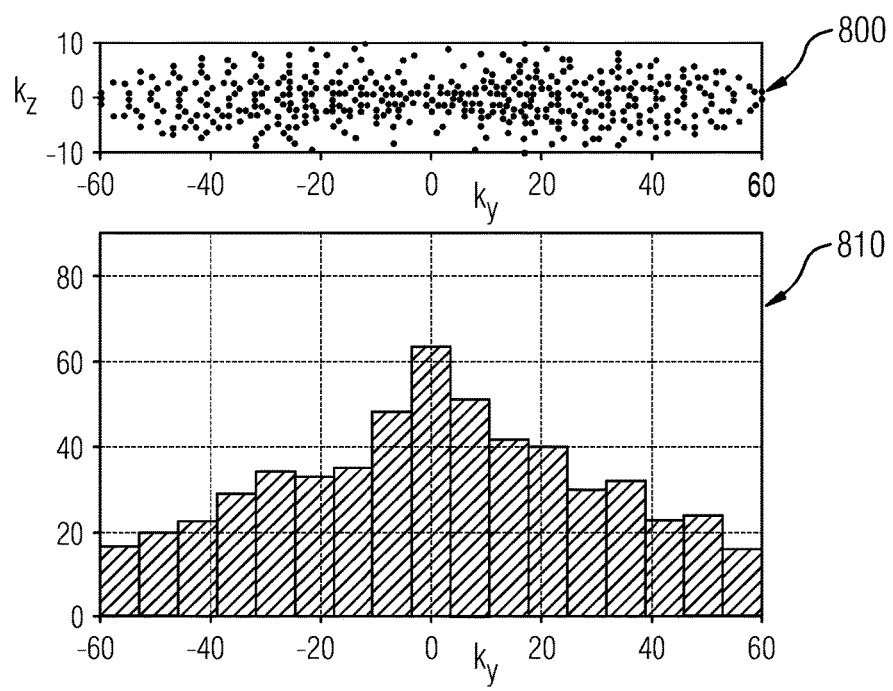
FIG. 8 depicts a representation of an acquisition template after an anisotropic image region correction according to an embodiment.

The anisotropic image region correction is depicted in FIGS. 7 to 10. FIG. 7 depicts an uncorrected acquisition template 700 in a ky/kz-plane of a k-space and an associated histogram that depicts the distribution of the spiral points along the ky-axis. A severely non-uniform distribution of the spiral points exists. In order to reduce the non-uniform distribution of the spiral points, the anisotropic image region correction is carried out that leads to the corrected acquisition template 800 depicted in FIG. 8.

Figure 9:
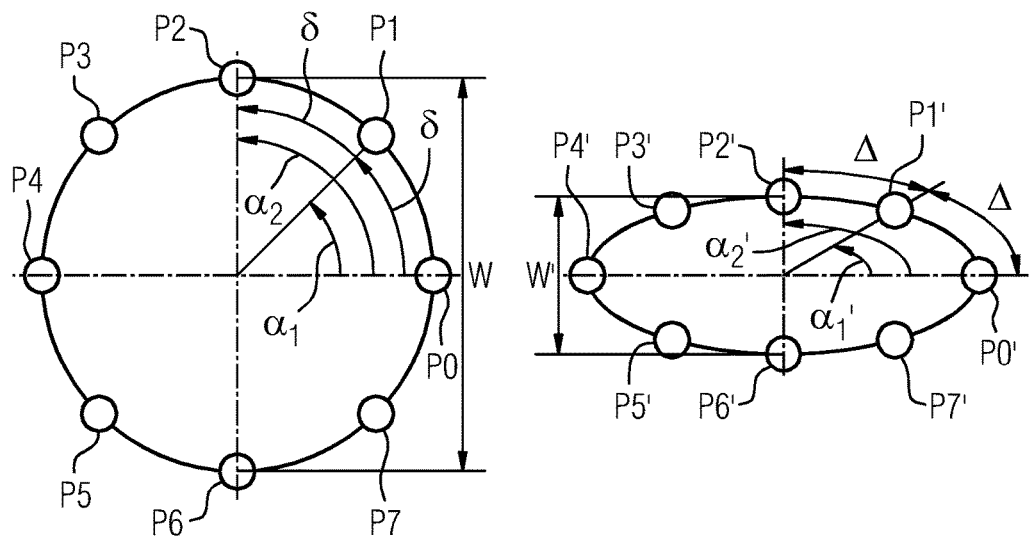
FIG. 9 depicts a sketch of the principle for an anisotropic image region correction according to an embodiment.
Figure 10:
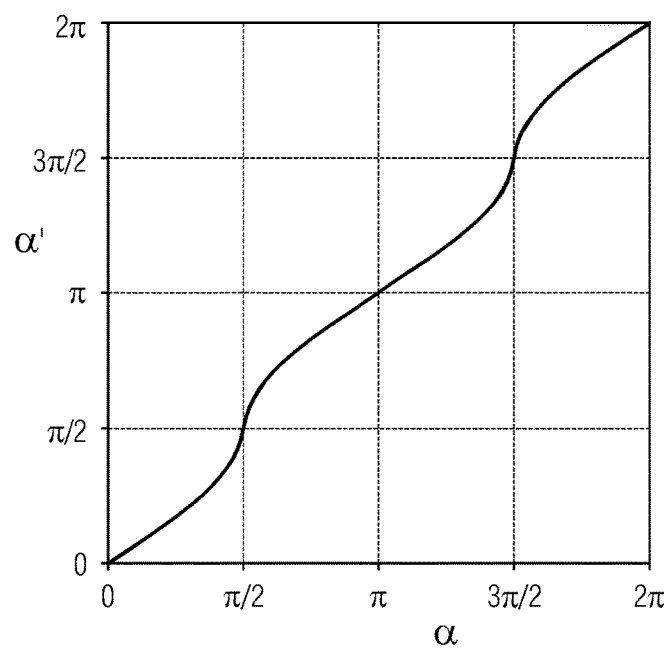
FIG. 10 depicts a representation of an allocation chart for an anisotropic image region correction according to an embodiment.

A possible principle of the anisotropic image region correction is depicted in FIG. 9. On the left-hand side, in an (isotropic) unit circle is depicted, for example, eight original points P0, P1, P2, P3, P4, P5, P6, P7. An original angular coordinate may be allocated to each of the original points, e.g. the angular coordinate α1 is allocated to point P1, the angular coordinate α2 is allocated to point P2 and the angular coordinate α0=0 (not shown) is allocated to point P0. The original angular coordinates α0 and α1 enclose a first angular region of size δ. The original angular coordinates α1 and α2 enclose a second angular region of the same size δ as the first angular region δ.

On the right side, an (anisotropic) ellipse transformed from the unit circle is depicted that is compressed by an anisotropy factor W/W'. From the original points P0, P1, P2, P3, P4, P5, P6, P7, result the corrected points P0', P1', P2', P3', P4', P5', P6', P7'. The corrected point P0' is defined by a first corrected angular coordinate α0'=0 (not shown here), and similarly P1' by a second corrected angular coordinate α1 and P2' by a third corrected angular coordinate α2'. The first and the second corrected angular coordinates α0', α1 adjoin a first arc length and the second and third corrected angular coordinates α1', α2' adjoin a second arc length, where the first and the second arc length each have the same length Δ.

A corrected angular coordinate α' may be allocated to an original angular coordinate α and thus the acquisition template may be corrected with an anisotropic image region correction. The correction takes place with an allocation chart as depicted for an exemplary anisotropy factor in FIG. 10. The allocation chart enables an allocation of equal polar angles to equal elliptical segment lengths.

Figure 11:
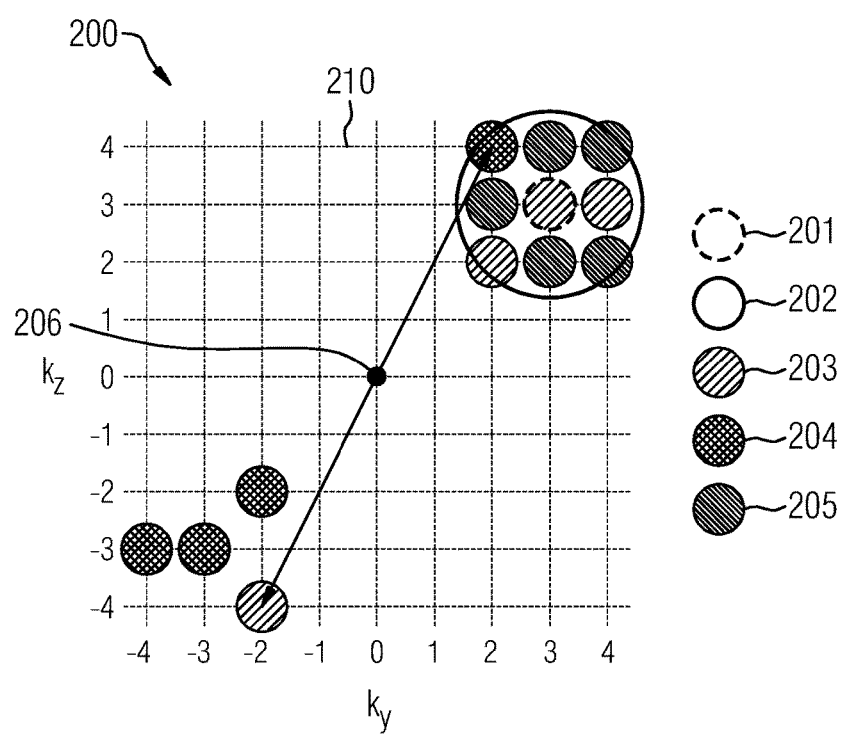
FIG. 11 depicts a sketch of a principle for testing a position of a spiral point for duplicity and a search for alternative positions according to an embodiment.

In FIG. 11, checking of a position of at least one of the plurality of spiral points for duplicity is illustrated. The k-space 200 is rastered with a grid 210, i.e. the plurality of spiral points lie on grid points of the grid 210. The grid point 201 is checked with the coordinates (ky,kz)=(3,3) for duplicity.

In an embodiment, the grid points 203 are already occupied, i.e. the grid points 203 are already sampled by spiral points. The checking reveals that the grid point (3,3) to be checked is already occupied, i.e. the grid point (3,3) is already sampled by another spiral point.

Consequently, a duplicity exists, so that an alternative position is sought. The search is delimited by a search radius 202, for example, only the directly adjacent grid points are taken into account. The points parallel to the ky axis are the grid points (2,3) and (4,3), the points parallel to the ky axis are the grid points (3,2) and (3,4), the points parallel to a bisector of the ky and kz axis are the grid points (2,4) and (4,2) as well as (2,2) and (4,4).

Similarly to the point (3,3) in the search, the grid points (2,3) and (4,3) are excluded as the grids points are already occupied. In the check for duplicity, symmetry properties of the k-space 200 are taken into account, for example, on use of a partial Fourier method. During the search for alternative positions, the grid points of which grid points 204 that are point-reflected about the center 206 of the k-space are already occupied are excluded. As candidates for an alternative position there remain the grid points 205. Of the grid points 205, a grid point, e.g. (3,4) is randomly specified as a new grid point.

Figure 5:
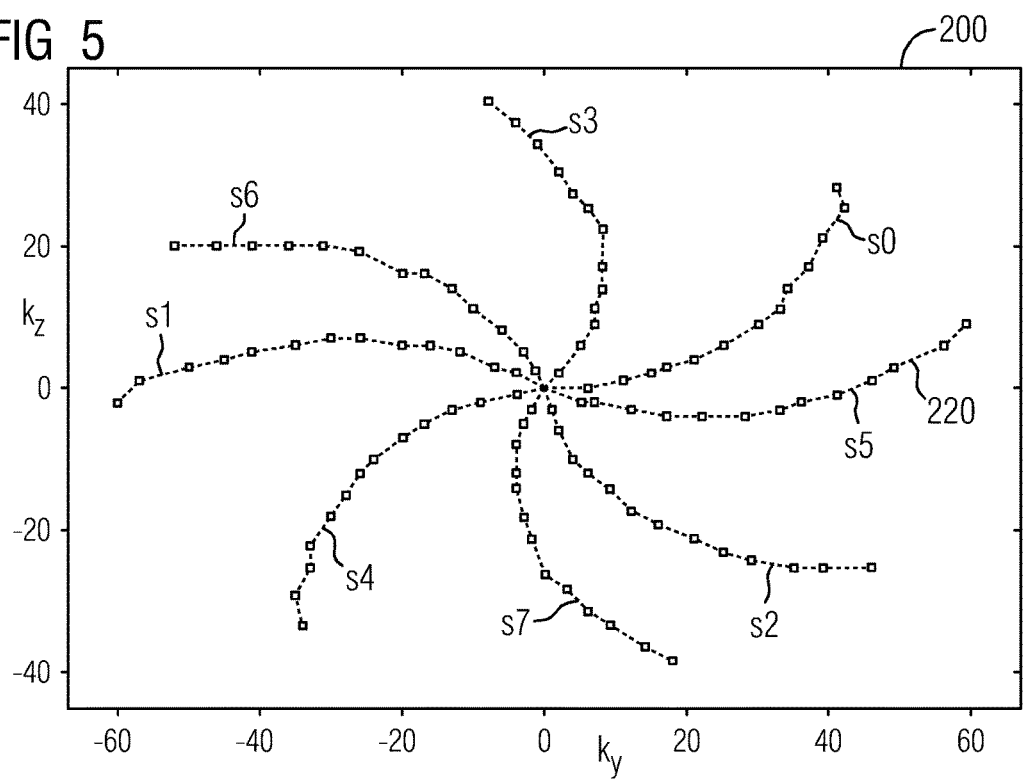
FIG. 5 depicts a representation of an acquisition template according to an embodiment.
Figure 6:
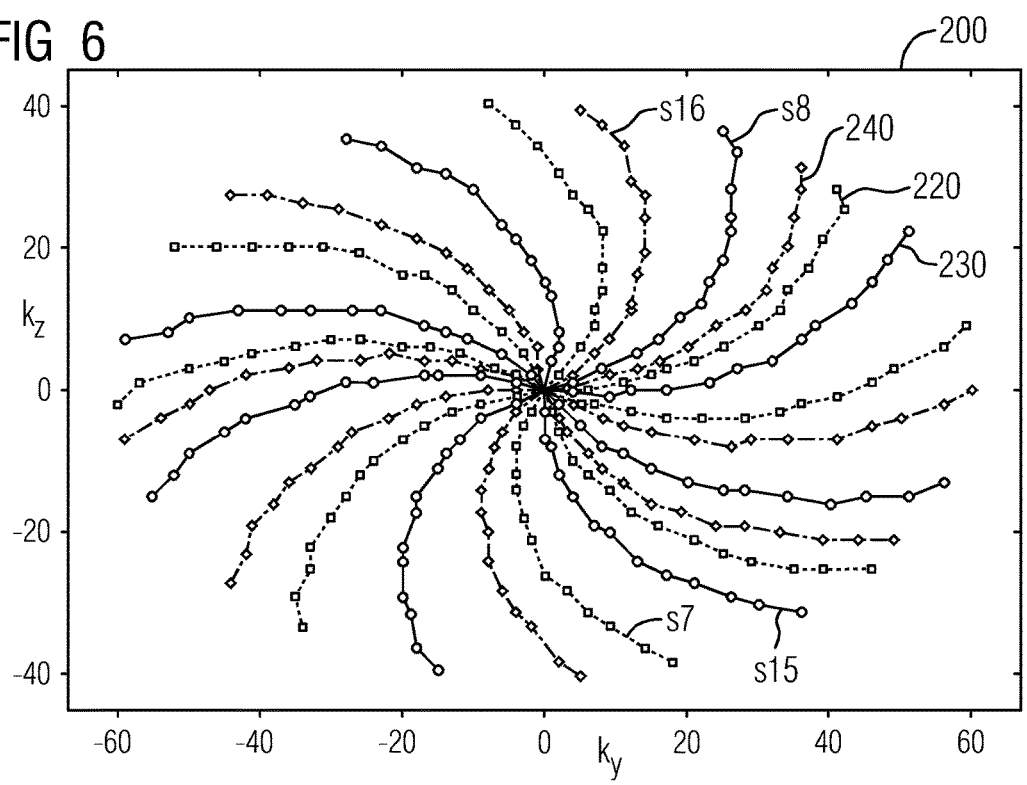
FIG. 6 depicts a representation of a plurality of acquisition templates according to an embodiment.

FIG. 5 depicts, by way of example, an acquisition template 220 that may result from an embodiment. The acquisition template includes eight spokes s0, s1, s2, s3, s4, s5, s6, s7, each with fourteen spiral points. However, more than just one acquisition template may also be generated, as depicted, for example, in FIG. 6. Through suitable offset angles, between each acquisition template, the spokes may be evenly distributed over the k-space 200 and no spoke is sampled more often than once.

The spoke s8 of the acquisition template 230 has an offset by the golden angle relative to the spoke s7 of the acquisition template 220. Furthermore, the spoke s16 of the acquisition template 240 has an offset by the golden angle relative to the spoke s15 of the acquisition template 230.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A method for generating at least one acquisition template for an acquisition of magnetic resonance signals, the method comprising:
   allocating, by a processor, a number of the plurality of spiral points that are allocated per spoke as a function of a temporal resolution;
   generating, by the processor, the at least one acquisition template, the at least one acquisition template comprising a plurality of spiral spokes in a k-space, wherein each spoke comprises the number of the plurality of spiral points; and
   acquiring, by a magnetic resonance apparatus, magnetic resonance signals using the at least one acquisition template.

2. The method of claim 1, wherein at least one of the plurality of spiral points of each spoke is located at the center of the k-space.

3. The method of claim 2, wherein the plurality of spiral points of the spokes at located in an acquisition template plane of a three-dimensional k-space.

4. The method of claim 3, further comprising:
   allocating, by the processor, a readout trajectory to each spiral point of the plurality of spiral points for which the magnetic resonance signals are acquired;
   wherein each readout trajectory intersects the acquisition template plane at the allocated spiral point.

5. The method of claim 1, wherein each of the plurality of spokes of an acquisition template includes an offset by a golden angle relative to at least one further spoke of the acquisition template.

6. The method of claim 1, wherein a number of the plurality of spiral points that are allocated per spoke is determined dependent upon a temporal resolution.

7. The method of claim 1, wherein a number of the plurality of spiral points that are allocated per spoke is determined dependent upon an undersampling.

8. The method of claim 1, wherein a position of the plurality of spiral points of a spoke is dependent upon a number of spiral points per spoke, an unsharpness value, an angular range value, a golden angle, or an angular offset value.

9. The method of claim 1, further comprising:
   transforming, by the processor, a position of the plurality of spiral points from a polar coordinate system into a Cartesian coordinate system.

10. The method of claim 9, wherein transforming is dependent upon at least one extent of an image region, at least one point density, or at least one extent of an image region and at least one point density.

11. The method of claim 1, wherein a position of the plurality of spiral points is rastered.

12. The method of claim 1, further comprising:
correcting, by the processor, an anisotropic region.

13. The method as claimed in claim 12 wherein a first and a second original angular coordinate enclose a first angular region, wherein the second and a third original angular coordinate enclose a second angular region, wherein the first and the second angular region are equal sized, wherein a first corrected angular coordinate is allocated to the first original angular coordinate, a second corrected angular coordinate is allocated to the second original angular coordinate and a third corrected angular coordinate is allocated to the third original angular coordinate, wherein a first and the second corrected angular coordinate adjoin a first arc length and the second and third corrected angular coordinate adjoin a second arc length, the first and the second arc length are equally long.

14. The method of claim 12, further comprising:
allocating, by the processor, a corrected angular coordinate to an original angular coordinate of a spiral point.

15. The method of claim 14, wherein the allocation is based on an allocation chart.

16. The method of claim 1, further comprising:
checking, by the processor, a position of at least one of the plurality of spiral points for duplicity.

17. The method of claim 16, wherein checking is a function of symmetry properties of the k-space.

18. The method of claim 16, further comprising:
identifying, by the processor, at least one alternative position when there is duplicity.

19. The method of claim 18, wherein the search for alternative positions is delimited by a search radius.

20. The method of claim 18, wherein one of the at least one alternative positions is randomly defined.

21. The method of claim 1, wherein a plurality of acquisition templates are generated.

22. The method of claim 21, wherein a spoke of one of the plurality of acquisition templates has an offset by a golden angle relative to a spoke of a further acquisition template.

23. An acquisition template generating unit comprising:
a processor configured to generate at least one acquisition template, the at least one acquisition template comprising a plurality of spiral spokes in a k-space, wherein each spoke comprises a plurality of spiral points, the processor further configured to check a position of at least one of the plurality of spiral points for duplicity; and
a receiver configured to acquire magnetic resonance signals using the at least one acquisition template.

24. A system comprising:
a magnetic resonance apparatus; and
an acquisition template generating unit comprising:
a processor configured to generate at least one acquisition template, the at least one acquisition template comprising a plurality of spiral spokes in a k-space, wherein each spoke comprises a plurality of spiral points the processor, further configured to correct an anisotropic region, wherein a first and a second original angular coordinate enclose a first angular region, wherein the second and a third original angular coordinate enclose a second angular region, wherein the first and the second angular region are equal sized, wherein a first corrected angular coordinate is allocated to the first original angular coordinate, a second corrected angular coordinate is allocated to the second original angular coordinate and a third corrected angular coordinate is allocated to the third original angular coordinate, wherein a first and the second corrected angular coordinate adjoin a first arc length and the second and third corrected angular coordinate adjoin a second arc length, the first and the second arc length are equally long; and
a receiver configured to acquire magnetic resonance signals using the at least one acquisition template.

* * * * *